United States Patent
Konoue et al.

(10) Patent No.: US 6,855,222 B2
(45) Date of Patent: Feb. 15, 2005

(54) METHOD FOR MANUFACTURING LAMINATED MULTILAYER ELECTRONIC COMPONENTS

(75) Inventors: Masaharu Konoue, Omihachiman (JP); Kimiharu Anao, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 10/448,048

(22) Filed: May 30, 2003

(65) Prior Publication Data

US 2004/0084131 A1 May 6, 2004

(30) Foreign Application Priority Data

Jun. 19, 2002 (JP) ........................................ 2002-178710
May 26, 2003 (JP) ........................................ 2003-147203

(51) Int. Cl.$^7$ ............................ B32B 31/26; H01F 1/34; H05K 3/46
(52) U.S. Cl. ................................ 156/89.16; 156/89.17; 156/89.18
(58) Field of Search ............................ 156/89.12, 89.16, 156/89.17, 89.18, 89.23; 427/96, 123, 125

(56) References Cited

U.S. PATENT DOCUMENTS

| | | | | |
|---|---|---|---|---|
| 4,493,789 A | * | 1/1985 | Ueyama et al. | 252/514 |
| 6,120,708 A | * | 9/2000 | Ohshita et al. | 252/511 |
| 6,641,898 B2 | * | 11/2003 | Yazaki et al. | 428/209 |
| 2001/0033474 A1 | * | 10/2001 | Sakai et al. | 361/321.2 |
| 2002/0050586 A1 | * | 5/2002 | Oshita et al. | 252/500 |

FOREIGN PATENT DOCUMENTS

| JP | 6-251619 | * | 9/1994 |
|---|---|---|---|
| JP | 7-326537 | * | 12/1995 |
| JP | 2987176 B2 | | 10/1999 |

* cited by examiner

Primary Examiner—Melvin C. Mayes
(74) Attorney, Agent, or Firm—Keating & Bennett, LLP

(57) ABSTRACT

A method for producing a laminated electronic component produces a laminated electronic component having a superior surge-proofing property, a sufficient resistance to a flux, and excellent electrical properties, without experience the occurrence of structural effects such as cracking, delamination, or other structural defects. Conductive paste is prepared to contain conductive particles and resin particles having a thermal decomposition-ability. The resin particles have an average particle size of about 0.25 to about 1.50 times the average particle size of the conductive particles. The volume ratio of the resin particles is in the range of about 0.5 to about 1.0 the volume of the conductive particles. The conductive paste is applied to the surface of a ceramic layer to form a conductor layer. The ceramic layers and the conductor layers are alternately laminated. The laminate is fired to form a ceramic sintered laminate. Thus, a laminated electronic component is produced.

20 Claims, 4 Drawing Sheets

METHOD FOR MANUFACTURING LAMINATED MULTILAYER ELECTRONIC COMPONENTS

BACKGROUND OF THE INVENTION

1. Field of the Invention

The present invention relates to a method of producing a laminated electronic component and, more particularly, to a method of producing a laminated electronic component such as a laminated inductor or other suitable device in which ceramic green sheet layers and electro-conductor layers made from conductive paste are laminated to each other and are fired to produce a ceramic sintered body.

2. Description of the Related Art

Ordinarily, in production of laminated ceramic electronic components, an electro-conductive paste for formation of internal electrodes is screen-printed to form a conductive pattern, a predetermined number of the ceramic sheets having the conductive patterns are laminated to form a laminate, the laminate is fired, and thereafter, external electrodes are formed.

In the laminated ceramic electronic components, the thermal expansion coefficient of the conductive material used to form the internal electrode is different from the thermal expansion coefficient of the ceramic material. The shrinking behaviors of the two materials are different from each other. Therefore, a tensile stress is developed between the ceramic body and the internal electrode when the laminate is fired and cooled. This may cause structural defects in the laminate such as delamination. Moreover, if ferrite is used as the ceramic material, the impedance and the inductance are reduced, which may disadvantageously affect the electrical properties of the electronic component.

Thus, it is presumed that the tensile stress between the internal electrode and the ceramic body can be reduced by reduction of the contact ratio of the internal electrode with the ceramic body.

In Japanese Patent No. 2987176 (Patent Literature 1) the following solution is proposed. A plurality of spaces are arranged inside of a magnetic material layer which is the ceramic body. Conductor layers which are internal electrodes are embedded in the spaces in such a manner that gaps having a predetermined size remain. The average cross-sectional area ratio of the conductor layers present in the spaces is in the range of 10% to 85%. The contact ratio of the conductor layers with respect to the magnetic layers in the spaces is up to 50%, and the average area ratio of the voids in the conductor layers is in the range of 1% to 50%.

According to Patent Literature 1, a conductor layer is formed by using conductive paste. The conductive paste is formed by mixing such that the area ratio of the region not containing conductive particles on the outer surface of a formed film is in the range of 20% to 60%. Then, the conductor layer is fired. Thereby, the average cross-sectional area ratio of the conductor layers in the spaces is in the range of 10% to 85%, and thus, voids are intentionally formed between the magnetic layers and the conductor layers. In this way, influences on the magnetic layers caused by expansion or shrinkage of the conductor layers are reduced as much as possible, and the reduction of the electrical properties is prevented.

According to Patent Literature 1, the average cross-sectional area ratio is in the range of 10% to 85%. When the average cross-sectional area ratio is decreased, the amount of conductive particles in the conductor layers is reduced. Therefore, problematically, the DC resistance is increased, and disconnection easily occurs when a surge current is applied. Recently, great attention has been paid to such problems because the line widths of internal electrodes are becoming smaller with the decreasing sizes of electronic components.

Moreover, when the cross-sectional area ratio is decreased, the volume of the gaps is increased. Therefore, problematically, a plating liquid or a flux easily enters the gaps. Sulfur contained in the plating liquid or flux exerts a hazardous influence over the conductive particles. Thus, the reliability is deteriorated.

SUMMARY OF THE INVENTION

In order to overcome the problems described above, preferred embodiments of the present invention provide a method of producing a laminated electronic component with a high reliability which has a superior surge-proofing property, a high resistance to flux, and satisfactory electrical properties, without the occurrence of structural defects such as cracks, delamination, or other structural defects.

The inventors of the present invention have made intensive investigation to suppress and prevent a tensile stress from occurring between an internal electrode and a ceramic body. As a result of this investigation, the following has been discovered: the density of the formed internal electrode can be increased without the continuity of the internal electrode being damaged by incorporating resin particles having a thermal decomposition-ability into conductive paste and setting the average particle size and the volume ratio of the resin particles to the conductive particles in the conductive paste to be in predetermined ranges. Thereby, the internal electrode can be prevented from coming into pressure-contact with the ceramic body at the interface between them, and the tensile stress can be relaxed. Moreover, generation of structural defects such as cracks, delamination, or other structural defects can be prevented. Hence, a laminated electronic component with a high reliability, superior electrical properties, and in which a plating liquid or other suitable material is prevented from entering the voids, can be reliably provided.

The present invention has been devised based on the above-described knowledge. The method of producing a laminated electronic component of preferred embodiments of the present invention includes laminating a ceramic green layer and a conductor layer made from conductive paste to each other to form a laminate and firing the laminate to produce a ceramic sintered laminate. The conductive paste includes conductive particles and resin particles having a thermal decomposition-ability. The resin particles have an average particle size which is preferably in the range of about 0.25 to about 1.50 times the average particle size of the conductive particles. Also, the volume of the resin particles is preferably in the range of about 0.5 to about 1.0 times the volume of the conductive particles.

Moreover, in the above-described method of preferred embodiments of the present invention, the resin particles are burned off below the sintering temperature of the conductive particles.

According to the method of preferred embodiments of the present invention, an organic component can be suppressed from remaining as residual carbon and the generation ratio of voids can be reduced.

Other features, elements, steps, characteristics and advantages of the present invention will become more apparent

DETAILED DESCRIPTION OF PREFERRED EMBODIMENTS

Hereinafter, preferred embodiments of the present invention will be described with reference to the accompanying drawings.

Figure 1:
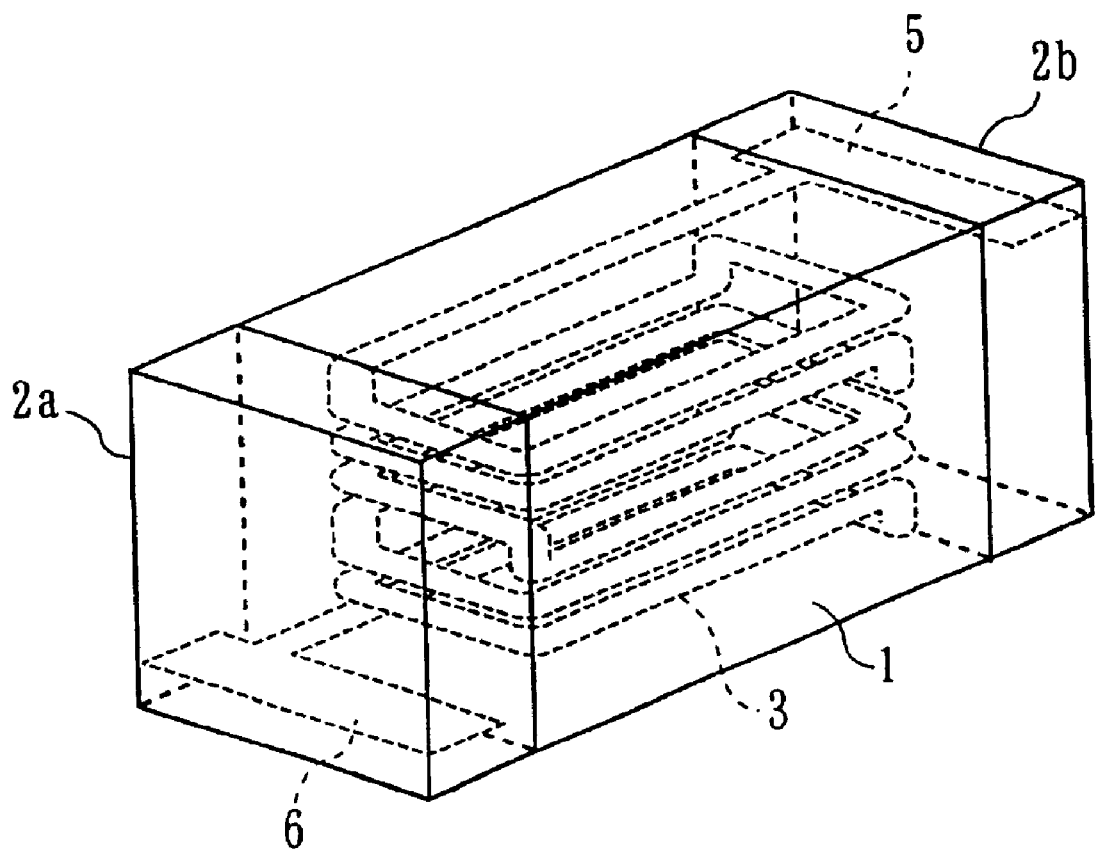
FIG. 1 is a perspective view of a laminated inductor produced according to a preferred embodiment of the present invention.
Figure 2:
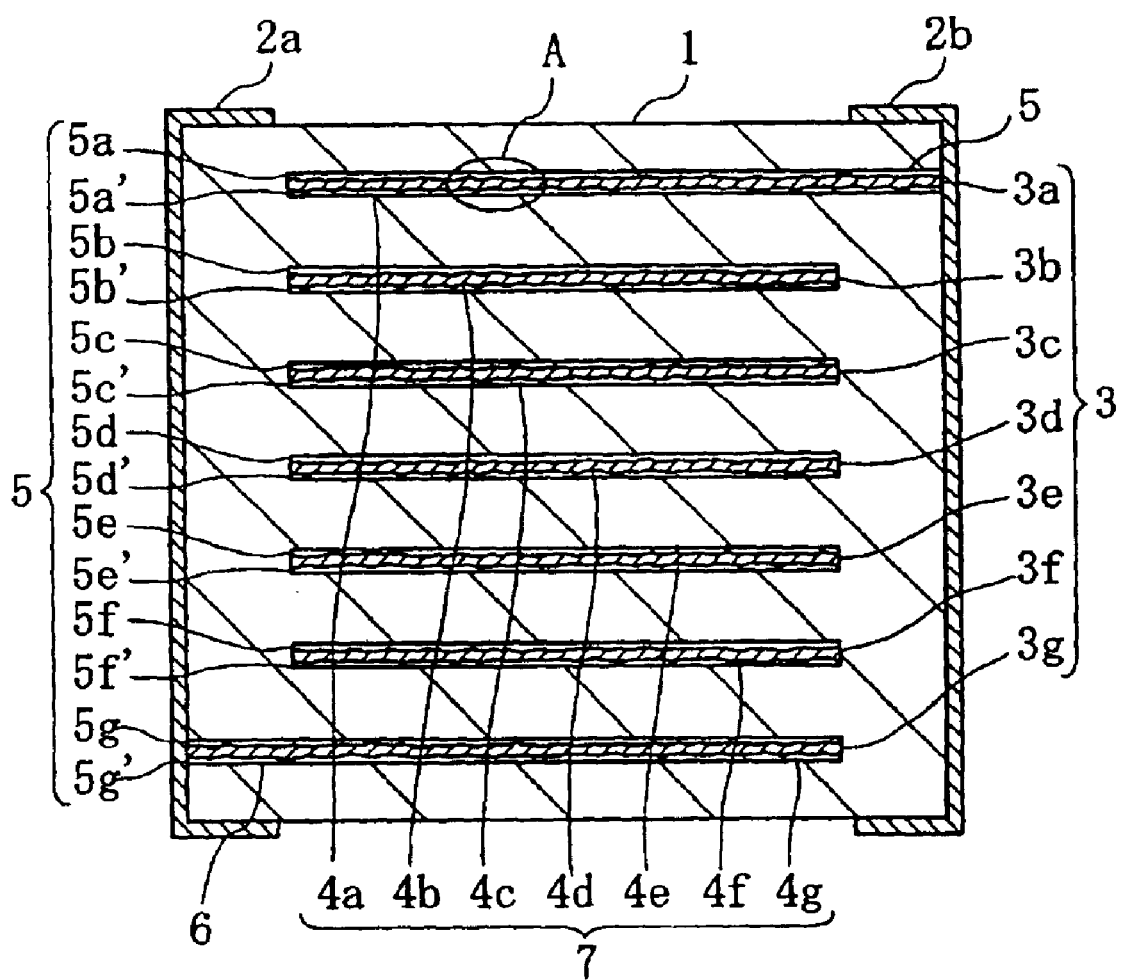
FIG. 2 is a longitudinal cross-sectional view of the laminated inductor produced according to a preferred embodiment of the present invention.

FIG. 1 is a perspective view of a laminated inductor produced according to a preferred embodiment of the present invention, which is an example of the laminated electronic component of the present invention. FIG. 2 is a cross-sectional view of the laminated inductor.

Referring to FIGS. 1 and 2, the laminated inductor includes a ceramic body 1 preferably made of an Ni—Zn—Cu ferrite type material, external electrodes 2a and 2b disposed on both of the end surfaces of the ceramic body 1, and an internal electrode 3 (3a to 3g) having a coil shape embedded in the ceramic body 1.

In particular, for the laminated inductor, spaces 4a to 4g are arranged substantially parallel to each other in the ceramic body 1. The internal electrodes 3a to 3g are disposed in the spaces 4a to 4g in such a manner as to have gaps 5a to 5g and gaps 5a' to 5g' between the internal electrodes 3a to 3g and the ceramic body 1, respectively.

Figure 3:
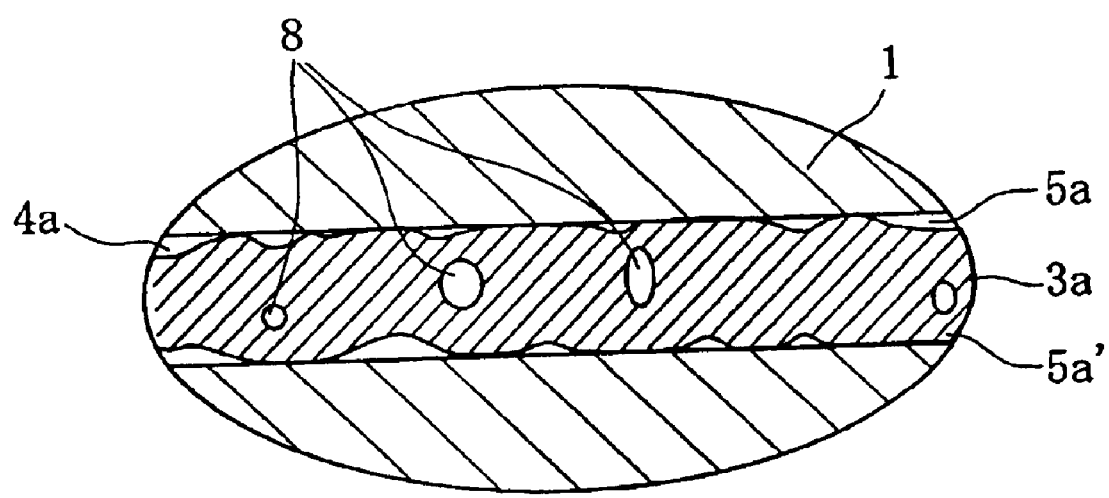
FIG. 3 is a partially enlarged view of portion A of FIG. 2.

Specifically, as shown in FIG. 3, the internal electrode 3a is partially in contact with the ceramic body 1 so as not to be pressed against the ceramic body 1. Moreover, voids are formed at the surface of the internal electrode 3a. In this preferred embodiment, the internal electrode 3a is described with reference to the partially enlarged view thereof. This description is true of the other internal electrodes 3b to 3g.

In this laminated inductor, a lead-out portion 6 of the internal electrode 3a is electrically connected to the external electrode 2b, and a lead-out portion 7 of the internal electrode 3g is electrically connected to the external electrode 2a Moreover, the internal electrodes 3a to 3g are connected in series with each other by via-holes (not shown) formed so as to extend in the vertical direction of the ceramic body 1 shown in FIG. 2, so that the internal electrodes form a coil pattern wound in the clock-wise direction.

Hereinafter, a method of producing the laminated inductor will be described.

First, conductive paste is prepared as described below.

In particular, an organic binder and a solvent are compounded, for example, at a ratio of about 1:9 to prepare an organic vehicle. Then conductive particles and resin particles having a thermal decomposition-ability are mixed and kneaded by using a three-roll mill to produce conductive paste.

In this case, the ratio of average particle size of the resin particles to average particle size of the conductive particles is preferably in the range of about 0.25 to about 1.50. The resin particles and the conductive particles are compounded in such amounts that the ratio of the volume of resin particles to the volume of conductive particles is preferably in the range of about 0.5 to about 1.0.

The reasons why the resin particles having a thermal decomposition-ability are used, why the average particle size ratio of the resin particles to the conductive particles is set to be in the above-mentioned range, and the volumes of the resin particles and the conductive particles are set to be in the above-mentioned range will be described below.

(1) The Reason for Use of Resin Particles Having Thermal Decomposition-Ability

The internal electrode 3 shrinks when the binder as an organic component included in the conductive paste is removed and the conductive particles are sintered, which occur during the firing process. If the organic component remains as residual carbon during the process of removing the binder, the residual carbon in the internal electrode 3 is gasified and expanded during the subsequent process of firing at high temperature. Thus, as shown in FIG. 3, the voids 8 are formed. The internal electrode 3 and the voids 8 expand so vigorously that they press against the ceramic body 1. As a result, the ceramic body 1 and the internal electrode 3 come into pressure-contact with each other at the interface between the ceramic body 1 and the internal electrode 3. Thus, diffusion of oxygen is hindered, and the oxygen remains at the interface. The internal electrode 3 and the ceramic body 1 are strongly chemically bonded to each other, so that a tensile stress is generated.

In other words, if the pressure-contact state at the interface is eliminated, the oxygen can be diffused outward and removed from the interface. Thus, the chemical bonding force is reduced, and the tensile stress is relaxed. Accordingly generation of structural defects such as cracks, delamination, and other structural defects can be avoided. To prevent the interface from getting into the pressure-contact state as completely as possible, it is necessary to form gaps 5 and 5'.

To form the above-described gaps 5 and 5', it is necessary to start the burning of the resin particles or completely burn off the resin particles before the conductive particles are sintered and to finish the sintering of the conductive paste earlier than that of the ceramic body. For example, in the case in which Ag particles are used as the conductive particles, it is required at least to start the burning-off of the resin particles below the sintering temperature of Ag which is in the range of about 300° C. to about 500° C. That is, it is required to use resin particles which have such a thermal decomposition-ability so as not to hinder the sintering of the conductive particles.

Thus, according to this preferred embodiment, resin particles having such a thermal decomposition-ability are preferably used.

Resins having this thermal decomposition-ability are, for example, acrylic resins, methacrylate resins, polypropylene resins, polyethylene resins, polystyrene resins, polyester resins, polyolefin resins, polyisobutylene resins, polyethyleneglycol resins. Other suitable materials may also be used.

More preferably, resins having a compression strength of about 70 MPa or higher are preferably used because the resin particles cannot easily be broken during the process of press-joining ceramic green sheets to each other, which results in the electronic component having superior electrical properties. Resins having a compression strength of about 70 MPa or higher are, for example, polymethylmethacrylate (PMMA) resins and polystyrene resins. The compression strengths of the resins, determined according to ASTM Testing Method D695, for example, are in the range of about 73 MPa to about 125 MPa for the PMMA resins and are in the range of about 82 MPa to about 89 MPa for the polystyrene resins.

(2) Average Particle Size Ratio of Resin Particles to Conductive Particles

The density of the formed internal electrode can be reduced by mixing resin particles having a low specific gravity with the conductive particles. Therefore, the shrinkage of the internal electrode can be increased, and gaps can be formed between the internal electrode and the ceramic body.

However, if the average particle size of the resin particles is less than about 0.25 times the average particle size of the conductive particles, the particle size of the resin particles is excessively small compared to the particle size of the conductive particles. Thus, the resin particles enter the gaps between the conductive particles. Thus, the density of the formed internal electrode can not be reduced and a desired high shrinkage can not be obtained.

If the average particle size of the resin particles exceeds about 1.5 times the average particle size of the conductive particles, the resin particles are relatively too large. Thus, the conductive particles can not come into contact with each other and are sintered in an island pattern. Thus, the continuity of the internal electrode is deteriorated.

According to this preferred embodiment, the average particle size ratio of the resin particles to the conductive particles is preferably set to be in the range of about 0.25 to about 1.5, preferably, about 0.6 to about 1.0.

As described above, the average particle size of the resin particles are decided based on the relationship to that of the conductive particles to be used. From the standpoint of the continuity of the internal electrode, it is preferable to uniformly disperse the conductive particles in the internal electrode. The average particle size of the conductive particles is preferably in the range of about 1.0 $\mu$m to about 4.0 $\mu$m, and more preferably in the range of about 1.0 $\mu$m to about 2.0 $\mu$m. Accordingly, the average particle size of the resin particles is preferably in the range of about 0.25 $\mu$m to about 6.0 $\mu$m, and more preferably in the range of about 0.25 $\mu$m to about 3.0 $\mu$m.

If the average particle size of the conductive particles is less than about 0.1 $\mu$m, the conductive particles are excessively fine and cohere to each other. Thus, it is difficult to uniformly disperse the conductive particles. Moreover, the conductive particles are easily diffused during the firing process.

If the average particle size of the conductive particles exceeds about 4.0 $\mu$m, only the conductive particles or only the resin particles are arranged in the thickness direction of the internal electrode. That is, an area is formed in which either the conductive particles or the resin particles are present in an excessively small amount. Thus, uniform dispersion can not be obtained. Therefore, in some cases, a desired high shrinkage can not be obtained, or the continuity of the internal electrode is damaged.

Accordingly, as described above, the average particle size of the conductive particles is preferably in the range of about 1.0 $\mu$m to about 4.0 $\mu$m, and more preferably, in the range of about 1.0 $\mu$m to about 2.0 $\mu$m. The average particle size of the resin particles is preferably in the range of about 0.25 $\mu$m to about 6.0 $\mu$m, and even more preferably, in the range of about 0.25 $\mu$m to about 3.0 $\mu$m.

(3) Volume Ratio of Resin Particles to Conductive particles

If the volume of the resin particles is less than about 0.5 times the volume of the conductive particles, the amount of the resin particles contained in the conductive paste is excessively small. Similarly to the case described in section (2) above, the density of the formed internal electrode can not be reduced. Thus, a desired high shrinkage can not be obtained.

If the volume of the resin particles is more than about 1.0 times the volume of the conductive particles, the amount of the resin particles is too large. Therefore, the conductive particles can not come into contact with each other and are sintered in an island-pattern. Thus, the continuity of the internal electrode is deteriorated.

Accordingly, in the present preferred embodiment, the volume ratio of resin particles to conductive particles is preferably in the range of about 0.5 to about 1, and more preferably, about 0.65 to about 0.85.

Moreover, in this preferred embodiment, the conductive paste is prepared so that the total amount of the resin particles and the conductive particles is preferably in the range of about 30% to about 60% by volume.

In particular, the conductive paste includes the conductive particles, the resin particles, and the organic vehicle, as described above. If the total amount of the resin particles and the conductive particles, which are solid contents, exceeds about 60% by volume, the amount of the organic vehicle is excessively small, so that the paste can not be formed.

If the total amount of the resin particles and the conductive particles is less than about 30% by volume, the amount of the organic vehicle is too large. Thus, even if the paste can be formed, the past may be unable to form an electrode pattern having a predetermined thickness when it is coated.

Accordingly, in this preferred embodiment, the conductive paste is prepared so that the total volume of the resin particles and the conductive particles is preferably in the range of about 30% to about 60%, and more preferably, in the range of about 40% to about 53%, of the total volume of the conductive paste.

The conductive particles may be any material provided that the material is electro-conductive. Ag, Pd, Pt, Au, Ni, Cu, or alloys including at least two kinds of the metals may be used.

As the organic binder included in the organic vehicle, ethyl cellulose resins, acrylic resins, butyral resins, or other suitable material may be used. As the solvent, $\alpha$-terpineol, tetraline, butyl carbitol, or other suitable material may be used.

The conductive paste is prepared as described above. Predetermined amounts of ferrite type materials such as NiO, CuO, ZnO, $Fe_2O_3$, and so forth are weighed out, and added to a ball mill, wet-mixed, and ground. Thereafter, the ground material is dried and calcined.

Next, the calcined material is added to the ball mill again and dried to produce a calcined powder. Thereafter, the calcined powder is mixed with a binder, a plasticizer, and a dispersant. The mixture is dispersed in a solvent to produce ceramic slurry. The ceramic slurry is formed into a sheet by a doctor-blade method or other suitable method to produce a ceramic green sheet.

Then, a via hole is formed at a predetermined position in the ceramic sheet so as to be passed through the sheet, and the above-described conductive paste is screen-printed on the surface of the ceramic green sheet to form a predetermined coil pattern.

Thereafter, a plurality of ceramic green sheets each having a coil pattern formed thereon are laminated to form a laminate in such a manner that the green sheets can be electrically connected in series with each other by the via-holes. The laminate is sandwiched between and held by ceramic green sheets having no coil pattern formed thereon and pressed to be joined. Thus, a press-joined block is formed.

Next, the press-joined block is cut to a predetermined size and is treated at a predetermined temperature (e.g., below about 500° C.), so that the binder is removed. Thereafter, the cut laminate is fired at a predetermined temperature (e.g., about 800% to about 900° C.) to produce a ceramic sintered laminate.

Referring to the treatment for removal of the binder, the burning off of the resin particles starts at a temperature (e.g., about 150° C.) which is lower than the sintering temperature (e.g., about 300° C.) of the conductive particles. Therefore, the regions from which the resin particles have been removed become voids. Thus, the removal of the binder is accelerated. The carbon-containing component is evaporated off, i.e., does not remain at a firing temperature of about 500° C. or higher.

Subsequently, the ceramic sintered laminate is barrel-polished. The conductive paste is coated on both of the ends of the ceramic sintered laminate, and fired to form external conduction portions.

Thereafter, a nickel coat and a tin coat are sequentially formed on the external conduction portions by electrolytic plating to form external electrodes 2a and 2b. Thus, a laminated inductor is produced.

According to this preferred embodiment, the conductive paste is used to form the internal electrode 3, in which the conductive paste includes the resin particles having a thermal decomposition-ability, the average particle size ratio of the resin particles to the conductive particles is preferably in the range of about 0.25 to about 1.50, and the volume ratio of the resin particles to the conductive particles is preferably in the range of about 0.50 to about 1.0. Thereby, (1) the average occupation ratio of the internal electrode in the space 4, represented by the average cross-sectional area ratio of the internal electrode to the space 4, is preferably in the range of about 86% to about 99%, (2) the average ratio of the areas of voids to the surface area of the internal electrode, that is, the average void area ratio is preferably in the range of about 0.1% to about 10%, and (3) the contact ratio of the internal electrode 3 to the ceramic body 1 in the space 4 is preferably up to about 60%. Thereby, even if the average cross-sectional area ratio is increased, no structural defects such as delamination, cracks, and other structural defects are caused, deterioration of the electrical properties can be prevented, the continuity of the internal electrode is enhanced, and the entering of a plating liquid or a flux into the gaps 5 and 5' can be reliably prevented. Thus, a laminated inductor having a high reliability can be provided.

The reasons why the cross-sectional area ratio, the void area ratio, and the contact ratio are set in the above-described ranges, respectively, will be described below.

(1) Cross-Sectional Area Ratio

If the cross-sectional area ratio is less than about 86%, the volume of the gaps 5 and 5' is excessively large in the space 4. Accordingly, the film-thickness of the internal electrode 3 is reduced, so that the amount of the conductive particles is decreased. The conductive particles are sintered in an island pattern, and the continuity of the internal electrode 3 is deteriorated. As a result, the DC resistance is increased, deterioration of the surge-proofing characteristic is caused, and a plating liquid or flux may enter the gaps 5 and 5'. Thus, the reliability is reduced.

If the cross-sectional area ratio exceeds about 99%, the contact ratio of the internal electrode 3 to the ceramic body 1 is increased and a tensile stress is developed between the internal electrode 3 and the ceramic body 1. Thus, the electrical properties such as inductance and impedance are deteriorated, and structural defects such as cracks tend to occur.

That is, the continuity of the internal electrode 3 can be assured and generation of structural defects can be prevented by setting the cross-sectional area ratio to be in the range of about 86% to about 99%.

(2) Void Area Ratio

Voids are inevitably formed in the internal electrode by the treatment for removal of the binder. If the void area ratio exceeds about 10%, the residual carbon is gasified and expanded by the treatment of removal of the binder and the firing. The internal electrode and the voids are pressed against the ceramic body 1. Thus, the internal electrode 3 comes into pressure-contact with the ceramic body 1.

Accordingly, the internal electrode 3 is prevented from coming into pressure-contact with the ceramic body 1 by setting the void area ratio to be in the range of about 0.1% to about 10%.

(3) Contact Ratio

From the standpoint of suppression of a tensile stress, it is preferable that the contact ratio of the internal electrode 3 to the ceramic body 1 is as low as possible, even if the cross-sectional area ratio is large. In particular, if the contact ratio exceeds about 60%, the length over which the internal electrode 3 is in contact with the ceramic piece 1 is long, so that a tensile stress tends to occur. Thus, the electrical properties may be deteriorated, and structural defects may be caused.

That is, the tensile stress is relaxed and the reduction of the electrical properties and the generation of structural defects are prevented by setting the contact ratio to be up to about 60%.

As described above, in this preferred embodiment, the internal electrode 3 is formed by use of the electroconductive paste, in which the average particle size ratio of the resin particles having a thermal decomposition-ability to the conductive particles is preferably in the range of about 0.25 to about 1.50, and the volume ratio of the resin particles to the conductive particles is preferably in the range of about 0.50 to about 1.0 Therefore, in the formed laminated inductor, the cross-sectional area ratio is preferably in the range of about 86% to about 99%, the void area ratio is preferably in the range of about 0.1% to about 10%, and the contact ratio is preferably up to about 60%. Thereby, the internal electrode 3 is prevented from coming into pressure-contact with the ceramic body 1 at the interface between the internal electrode 3 and the ceramic body 1. Thus, development of a tensile stress is reliably prevented. Thus, generation of structural defects and deterioration of the electrical properties is prevented. Moreover, the continuity of the internal electrode is prevented from being deteriorated, and a plating liquid or flux is prevented from entering the gaps 5 and 5'. Thus, a laminated inductor having a high reliability can be obtained.

The present invention is not restricted to the above-described preferred embodiments. In preferred embodiments described above, the ferrite material is preferably used as the ceramic material. Needless to say, glass powdery materials and other ceramic materials can be applied.

Moreover, in the above-described preferred embodiments, a sheet-processing method is used in which a plurality of ceramic green sheets are laminated. Needless to say, other processing methods such as printing process or suitable methods can be used.

Hereinafter, examples of preferred embodiments of the present invention will be described.

EXAMPLE 1

Predetermined amounts of ferrite type materials such as NiO, CuO, ZnO, $Fe_2O_3$, and other suitable material were weighed out. Thereafter, the weighed-out materials were placed into a ball mill containing PSZ (partially stabilized zirconia) with a diameter of about 1 mm as grinding media, wet-mixed, and ground to form a slurry-like powder. The slurry-like powder was separated from the PSZ, dried by means of a spray-drier, and calcined at a temperature of about 650° C. for 2 hours. Thus, a calcined material was produced.

Subsequently, the calcined material was placed into the ball mill again, sufficiently wet-ground, and dried by means of a spray-drier to form a calcined powder.

Subsequently, to the calcined material, polyvinylbutyral as a binder, dibutyl phthalate as a plasticizer, an ammonium polycarboxylate as a dispersant, and toluene and ethyl alcohol as solvents were added and mixed to prepare ceramic slurry. Then, the ceramic slurry was formed into a sheet by a doctor blade method. Thus, a magnetic sheet (ceramic green sheet) having a thickness of about 50 μm was prepared.

Conductive paste was prepared as follows.

α-terpineol was used as a solvent, and an ethyl cellulose resin was used as an organic binder. The ethyl cellulose resin was dissolved in the α-terpineol at a ratio by volume of the ethyl cellulose resin to the α-terpineol of about 10:90 to prepare an organic vehicle.

Then, Ag particles with an average particle size of about 1.5 μm and polyacrylate resin particles (hereinafter, referred to as resin particles) with an average particle size of about 1.0 μm were prepared. The Ag particles and the resin particles were sufficiently mixed with the organic vehicle (ethyl cellulose resin: α-terpineol=6% by volume: 54% by volume) so that the amount of the Ag particles was about 23% by volume and that the amount of the resin particles was about 17% by volume. Thus, the conductive paste was prepared.

Subsequently, via-holes were formed in the internal electrodes by means of a laser machine in such a manner that the internal electrodes can be electrically connected in series with each other. Electrode patterns are screen-printed by use of the above-described conductive paste. Thus, coil patterns with a film-thickness of about 40 μm and a line width of about 120 μm were formed. The film-thickness was measured by means of a laser displacement meter.

Thereafter, a plurality of the magnetic sheets having the coil patterns formed thereon were laminated to form a laminate. The laminated were sandwiched between and held by magnetic sheets having no coil patterns formed thereon. The laminate was press-joined to each other at a pressure of about $9.6 \times 10^7$ Pa (1000 kgf/cm$^2$). Thus, a press-joined block was formed.

Then, the press-joined block was cut to a predetermined size, treated for removal of the binder at a temperature of about 500° C. or lower, and fired at a temperature of about 870° C. to prepare a ceramic sintered laminate.

In addition, by the inventors of the present invention, Ag paste for external electrodes was prepared in which glass frits and an organic vehicle were added to Ag powder, followed by dispersion thereof. The above-described ceramic sintered laminate was barrel-polished. The Ag paste for external electrodes was applied to both of the ends of the ceramic sintered laminate, and fired at about 700° C. Thus, external conduction portions were formed.

Thereafter, a nickel film and a tin film were sequentially formed on the surfaces of the external conduction portions by a well-known electrolytic plating. Thus, a laminated inductor with approximate dimensions of 1.6 mm in length× 0.8 mm in width×0.8 mm in thickness was produced.

EXAMPLE 2

A laminated inductor of Example 2 was-produced by the same manners and procedures as described in Example 1 except that in the conductive paste the amount of the Ag particles was about 20% by volume and the amount of the resin particles was about 20% by volume.

EXAMPLE 3

A laminated inductor of Example 3 was produced by the same manners and procedures as described in Example 1 except that in the conductive paste the amount of the Ag particles was about 26% by volume and the amount of the resin particles was about 14% by volume.

EXAMPLE 4

A laminated inductor of Example 4 was produced by the same manners and procedures as described in Example 1 except that in the conductive paste the average particle size of the Ag particles was about 1.0 μm, the amount of the Ag particles was about 26% by volume, the average particle size of the resin particles was about 0.7 μm, and the amount of the resin particles was about 14% by volume.

EXAMPLE 5

A laminated inductor of Example 5 was produced by the same manners and procedures as described in Example 1 except that in the conductive paste the average particle size of the Ag particles was about 2.0 μm, the amount of the Ag particles was about 24% by volume, the average particle size of the resin particles was about 1.5 μm, and the amount of the resin particles was about 16% by volume.

EXAMPLE 6

A laminated inductor of Example 6 was produced by the same manners and procedures as described in Example 1 except that in the conductive paste the average particle size of the Ag particles was about 1.2 μm and the average particle size of the resin particles was about 0.3 μm.

EXAMPLE 7

A laminated inductor of Example 7 was produced by the same manners and procedures as described in Example 1 except that in the conductive paste the average particle size of the Ag particles was about 1.2 μm and the average particle size of the resin particles was about 1.8 μm.

COMPARATIVE EXAMPLE 1

A laminated inductor of Comparative Example 1 was produced by the same manners and procedures as described in Example 1 except that in the conductive paste the amount of the Ag particles was about 18% by volume and the amount of the resin particles was about 22% by volume.

COMPARATIVE EXAMPLE 2

A laminated inductor of Comparative Example 2 was produced by the same manners and procedures as described in Example 1 except that in the conductive paste the amount of the Ag particles was about 35% by volume and the amount of the resin particles was about 5% by volume.

COMPARATIVE EXAMPLE 3

A laminated inductor of Comparative Example 3 was produced by the same manners and procedures as described in Example 1 except that in the conductive paste the average particle size of the resin particles was about 0.3 µm.

COMPARATIVE EXAMPLE 4

A laminated inductor of Comparative Example 4 was produced by the same manners and procedures as described in Example 1 except that in the conductive paste the average particle size of the resin particles was about 2.6 µm.

COMPARATIVE EXAMPLE 5

A laminated inductor of Comparative Example 5 was produced by the same manners and procedures as described in Example 1 except that in the conductive paste the amount of the Ag particles was about 28% by volume and the amount of the resin particles was about 12% by volume.

Then, by the inventors of the present invention, the respective test samples (Examples and Comparative Examples) were mirror-finished by polishing and processed by a focused ion beam device (FIB) (SMI-9200, manufactured by Seiko Instruments Inc.). The processed surfaces of the test samples were observed by means of a scanning microscopy (SIM) contained in the FIB. The observed images were image-processed, and the cross-sectional area ratio, the void area ratio, and the contact ratio of the respective test pieces were determined.

Regarding the observation positions of the respective test samples, three points, i.e., the lead-out portion of the internal electrode, the end of the internal electrode in opposition to the lead-out portion, and the center portion of the internal electrode were measured in the region of about 100 µm in length×about 100 µm in width for each sample. The average values were calculated.

The inductance at 1 MHz and the impedance at 100 MHz were measured by means of a RF impedance analyzer (HP4291A, manufactured by Hewlett-Packard Co.).

For each test sample, 100 test pieces were used for a test of surge-proofing, test the resistance to a water-soluble flux and to observe whether structural defects are present.

For the surge-proofing test, surge current at about 30 kV was applied. The disconnection ratio was calculated and evaluated.

The test of the resistance to a water-soluble flux was carried out as follows.

An adhesive was applied to the back surface of each test piece and bonded to a substrate having a predetermined size. The substrate was placed into an oven with a temperature of about 150° C. for 20 minutes to harden the adhesive. Thereafter, the substrate was dipped into a water-soluble flux for flow-soldering. The test piece was rinsed with water, dried, and let to stand at ordinary temperature for about 500 hours. A test piece of which the difference between the DC resistances before and after the standing was in the range of approximately ±0.1 Ω was evaluated as a non-defective product.

Regarding the structural defects, the mirror-polished cross-section of a test piece was observed with a stereo microscope. The presence or absence of cracks and delamination was observed and evaluated Table 1 shows the main specifications of the conductive pastes for the respective test samples (the average particle size ratio of the resin particles to the conductive particles, the volume ratio of the resin particles to the conductive particles, the cross-sectional area ratio, the void area ratio, and the contact ratio). Table 2 shows the test results of inductance, impedance, surge, and a flux, and the generation ratio of structural defects.

| | | Ag particles | | Resin particles | | | | Cross- | | |
|---|---|---|---|---|---|---|---|---|---|---|
| | | Average particle size (µm) | Content (vol %) | Average particle size (µm) | Content (vol %) | Average particle size Ratio | Volume ratio | sectional area ratio (%) | Void area ratio (%) | Contact ratio (%) |
| Example | (1) | 1.5 | 23 | 1.0 | 17 | 0.67 | 0.74 | 95 | 1.2 | 18 |
| | (2) | 1.5 | 20 | 1.0 | 20 | 0.67 | 1 | 86 | 0.3 | 15 |
| | (3) | 1.5 | 26 | 1.0 | 14 | 0.67 | 0.54 | 99 | 5.0 | 30 |
| | (4) | 1.0 | 26 | 0.7 | 14 | 0.70 | 0.54 | 99 | 0.1 | 19 |
| | (5) | 2.0 | 24 | 1.5 | 16 | 0.75 | 0.67 | 90 | 2.9 | 24 |
| | (6) | 1.2 | 23 | 0.3 | 17 | 0.25 | 0.74 | 99 | 4.5 | 28 |
| | (7) | 1.2 | 23 | 1.8 | 17 | 1.50 | 0.74 | 93 | 1.5 | 20 |
| Comparative example | (1) | 1.5 | 18 | 1.0 | 22 | 0.67 | 1.22 | 80 | 0.1 | 12 |
| | (2) | 1.5 | 35 | 1.0 | 5 | 0.67 | 0.14 | 99.5 | 12.0 | 90 |
| | (3) | 1.5 | 23 | 0.3 | 17 | 0.20 | 0.74 | 99.5 | 11.1 | 72 |
| | (4) | 1.5 | 23 | 2.6 | 17 | 1.73 | 0.74 | 84 | 2.7 | 14 |
| | (5) | 1.5 | 28 | 1.0 | 12 | 0.67 | 0.43 | 99.5 | 10.8 | 70 |

| | | Inductance (µH) | Impedance (Ω) | Surge-disconnection ratio (%) | Flux-resistance defective generation ratio (%) | Generation ratio of structural defects (%) |
|---|---|---|---|---|---|---|
| Example | (1) | 6.8 | 312 | 0 | 0 | 0 |
| | (2) | 6.9 | 323 | 0 | 0 | 0 |
| | (3) | 6.5 | 298 | 0 | 0 | 0 |
| | (4) | 6.8 | 314 | 0 | 0 | 0 |

-continued

|  |  | Inductance (μH) | Impedance (Ω) | Surge-disconnection ratio (%) | Flux-resistance defective generation ratio (%) | Generation ratio of structural defects (%) |
|---|---|---|---|---|---|---|
|  | (5) | 6.7 | 307 | 0 | 0 | 0 |
|  | (6) | 6.7 | 302 | 0 | 0 | 0 |
|  | (7) | 6.8 | 311 | 0 | 0 | 0 |
| Comparative | (1) | 7.0 | 330 | 16 | 22 | 0 |
| Example | (2) | 3.9 | 176 | 0 | 0 | 11 |
|  | (3) | 5.7 | 253 | 0 | 0 | 3 |
|  | (4) | 6.9 | 322 | 1 | 3 | 0 |
|  | (5) | 5.6 | 251 | 0 | 0 | 2 |

As seen in Tables 1 and 2, for the sample of Comparative Example 1, the volume ratio is large, approximately 1.22, and the amount of the Ag particles contained in the internal electrode is small. Thus, the internal electrode is sintered in an island-pattern, reducing the continuity of the internal electrode. The disconnection ratio is about 16%, determined by the test of surge-proofing, and the defective ratio is about 22%, determined by the test of the resistance to a water-soluble flux. Thus, the DC resistance is increased.

For the sample of Comparative Example 2, the volume ratio is small, 0.14. The amount of the resin particles is excessively small. Thus, there are many positions of the internal electrode where it is in pressure-contact with the ceramic body. Accordingly, the tensile stress between the internal electrode and the ceramic member is large. The electrical properties such as inductance and impedance are deteriorated. The generation ratio of structural defects is 11%.

For the sample of Comparative Example 3, the average particle size is small, 0.20. Therefore, the resin particles enter the gaps between the conductive particles, so that the density of a formed internal electrode can not be reduced and the internal electrode comes into pressure-contact with the ceramic body at many points of the internal electrode. Accordingly, the tensile stress caused between the internal electrode and the ceramic body is large, the electrical properties such as inductance and impedance are reduced, and the generation ratio of structural defects is 3%.

For the sample of Comparative Example 4, the average particle size is large, 1.73. Thus, the conductive particles can not be brought into contact with each other and are sintered in an island pattern. Thus, the continuity of the internal electrode is reduced. The disconnection occurs in the surge-proofing test. Also, defective test pieces are found in the test of the resistance of a water-soluble flux. The DC resistance is increased.

For the sample of Comparative Example 5, the volume ratio is small, 0.43. Because the amount of the resin particles is small, the internal electrode comes into contact with the ceramic member at many points of the internal electrode. Thus, the tensile stress caused between the internal electrode and the ceramic member is large. The electrical properties such as inductance and impedance are reduced. Generation of structural defects occurs.

For the samples of Examples 1 to 7, the average particle sizes are in the range of about 0.25 to about 1.50, and the volume ratios are in the range of about 0.54 to about 1.00. Accordingly, the electrical properties such as inductance and impedance are superior. The results of the test of surge-proofing and flux-resistance are satisfactory. No structural defects are found. Moreover, for the samples of Examples 1 to 7, the average cross-sectional area ratios are in the range of about 86 to about 99%, the average void area ratios are in the range of about 0.1 to about 5.0%, and the contact ratios are up to about 30%. For the laminated inductors having the cross-sectional area ratios, the void area ratios, and the contact ratios in the above-described ranges, the electrical properties such as inductance and impedance are superior. The results of the test of surge-proofing and flux-resistance are satisfactory. No structural defects are found.

Figure 4:
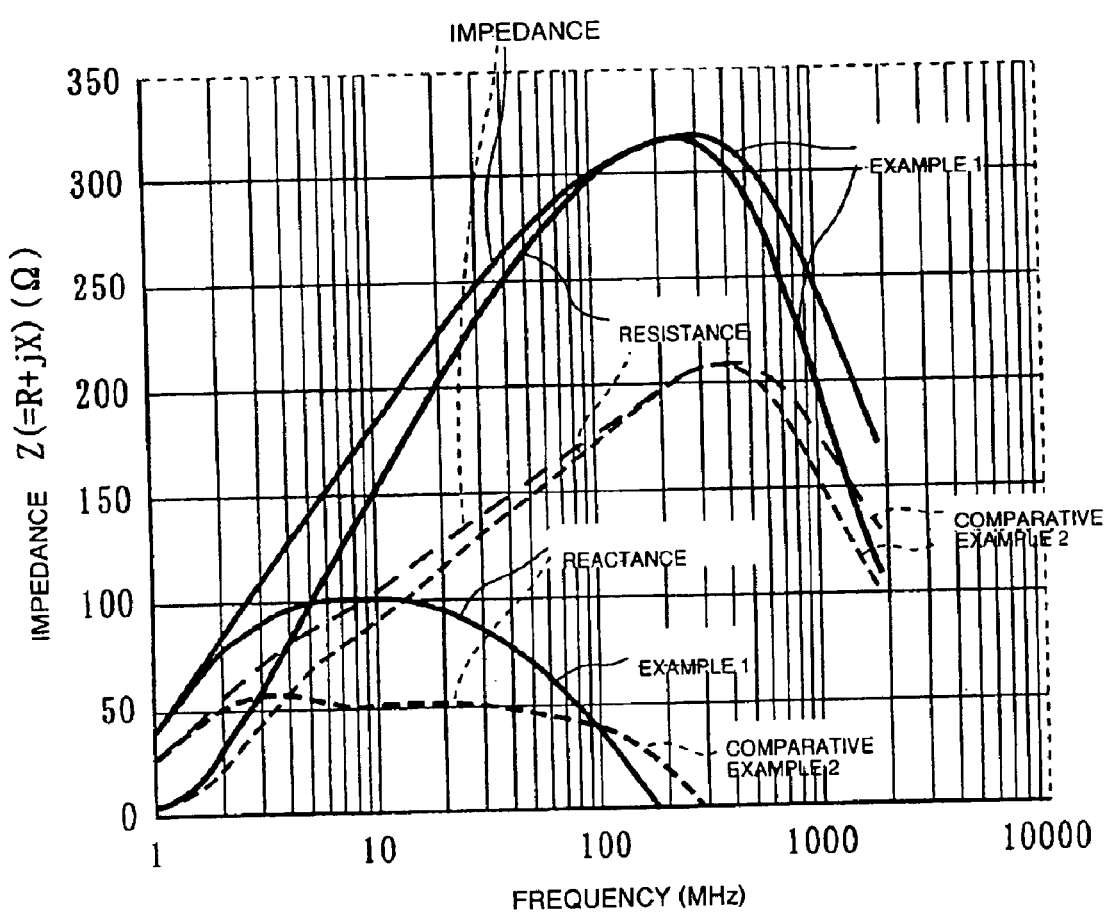
FIG. 4 is a graph showing the impedance characteristic of Example 1 and of Comparative Example 1.

Moreover, the impedance characteristic, and the characteristics of the resistance R and the reactance X constituting the impedance are measured, as shown in FIG. 4. In FIG. 4, the frequency F (MHz) is plotted on the abscissa and the impedance Z ($Z=R+jX$) (Ω) is plotted on the ordinate.

As seen in FIG. 4, it has been identified that the characteristics of the sample of Example 1 are superior to those of the sample of Comparative Example 2.

As described above, the method of producing a laminated electronic component of the present invention includes laminating a ceramic green layer and a conductor layer made from conductive paste to each other to form a laminate, and firing the laminate to produce a ceramic sintered laminate. The conductive paste includes conductive particles and resin particles having a thermal decomposition-ability. The resin particles have an average particle size which is about 0.25 to about 1.50 times the average particle size of the conductive particles. The volume of the resin particles is in the range of about 0.5 to about 1.0 time the volume of the conductive particles. Accordingly, by incorporating the resin particles having a thermal decomposition-ability, the density of a press-joined laminate can be reduced and the evaporation-expansion is suppressed. Thus, the internal electrode can be prevented from coming into pressure-contact with the ceramic piece at the interface between the internal electrode and the ceramic body, and the continuity of the internal electrode can be improved. Accordingly, a method of producing a laminated electronic component with a high reliability, which has a superior surge-proofing property, a high resistance to a flux, and superior electrical properties can be provided without occurring structural defects such as cracks, delamination, or other structural defects.

Moreover, the resin particles are burned off at a temperature which is lower than the sintering temperature of the conductive particles. Thus, an organic component is prevented from remaining as residual carbon. Accordingly, the void generation ratio can be reduced.

While preferred embodiments of the invention have been described above, it is to be understood that variations and modifications will be apparent to those skilled in the art without departing the scope and spirit of the invention. The scope of the invention, therefore, is to be determined solely by the following claims.

What is claimed is:

1. A method of producing a laminated electronic component comprising:
   laminating at least one ceramic green layer and at least one conductor layer made from conductive paste to each other to form a laminate;
   firing the laminate to produce a ceramic sintered laminate; and
   forming at least one external electrode on the ceramic sintered laminate; wherein
   the conductive paste includes conductive particles and resin particles having a thermal decomposition-ability;
   the resin particles have an average particle size in the range of about 0.25 to about 1.50 times the average particle size of the conductive particles; and the volume of the resin particles is in the range of about 0.5 to about 1.0 times the volume of the conductive particles.

2. A method of producing a laminated electronic component according to claim 1, wherein the resin particles are burned off below the sintering temperature of the conductive particles.

3. A method of producing a laminated electronic component according to claim 1, wherein the ratio of the cross-sectional area of an internal electrode formed of the conductive paste during the step of firing to the cross-sectional area of a space surrounding the internal electrode during the step of firing is in the range of about 86% to about 99%.

4. A method of producing a laminated electronic component according to claim 1, wherein the laminated electronic component is an inductor.

5. A method of producing a laminated electronic component according to claim 1, wherein the ratio of the surface area of voids formed in an internal conductor formed of the conductive paste during the step of firing to the surface area of the internal electrodes is in the range of about 0.1% to about 10%.

6. A method of producing a laminated electronic component according to claim 1, wherein via-holes are used to connect a plurality of the at least one conductor layers.

7. A method of producing a laminated electronic component according to claim 1, wherein the contact ratio of an internal electrode formed of the conductive paste during the step of firing to a space surrounding the internal electrode formed during the step of firing is up to about 60%.

8. A method of producing a laminated electronic component according to claim 1, wherein the ceramic green layer includes a ferrite material.

9. A method of producing a laminated electronic component according to claim 8, wherein the ferrite material is Ni—Zn—Cu.

10. A method of producing a laminated electronic component according to claim 1, wherein the resin particles start to burn before the conductive particles are sintered.

11. A method of producing a laminated electronic component according to claim 1, wherein the conductive paste finishes sintering before the ceramic body finishes sintering.

12. A method of producing a laminated electronic component according to claim 1, wherein the resin particles include at least one of acrylic resin, methacrylate resin, polypropylene resin, polyethylene resin, polystyrene resin, polyester resin, polyolefin resin, polyisobutylene resin, and polyethyleneglycol resin.

13. A method of producing a laminated electronic component according to claim 1, wherein the resin particles include a resin having a compression strength of about 70 MPa or higher.

14. A method of producing a laminated electronic component according to claim 1, wherein the resin particles have an average particle size in the range of about 0.6 to about 1.0 times the average particle size of the conductive particles.

15. A method of producing a laminated electronic component according to claim 1, wherein the volume of the resin particles is in the range of about 0.65 to about 0.85 times the volume of conductive particles.

16. A method of producing a laminated electronic component according to claim 15, wherein the total volume of the resin particles and conductive particles is about 40% to about 53% of the total volume of the conductive paste.

17. A method of producing a laminated electronic component according to claim 1, wherein the total volume of the resin particles and conductive particles is about 30% to about 60% of the total volume of the conductive paste.

18. A method of producing a laminated electronic component according to claim 1, wherein the conductive paste further comprises an organic binder.

19. A method of producing a laminated electronic component according to claim 18, wherein the organic binder includes at least one of ethyl cellulose resin, acrylic resin, and butyral resin.

20. A method of producing a laminated electronic component according to claim 1, wherein the conductive particles include particles made of at least one of Ag, Pd, Pt, Au, Ni, and Cu.

* * * * *